(12) United States Patent
Bohi et al.

(10) Patent No.: US 9,971,000 B2
(45) Date of Patent: May 15, 2018

(54) SIMPLE MICROWAVE FIELD IMAGING DEVICE

(71) Applicant: UNIVERSITAT BASEL, Basel (CH)

(72) Inventors: Pascal Bohi, Zuzwil (CH); Max F. Riedel, Munich (DE); Theodor W. Hansch, Munich (DE); Philipp Treutlein, Basel (CH)

(73) Assignee: UNIVERSITAT BASEL, Basel (CH)

( * ) Notice: Subject to any disclaimer, the term of this patent is extended or adjusted under 35 U.S.C. 154(b) by 660 days.

(21) Appl. No.: 14/387,256

(22) PCT Filed: Mar. 23, 2013

(86) PCT No.: PCT/EP2013/056172
§ 371 (c)(1),
(2) Date: Sep. 23, 2014

(87) PCT Pub. No.: WO2013/139989
PCT Pub. Date: Sep. 26, 2013

(65) Prior Publication Data
US 2015/0048824 A1     Feb. 19, 2015

(30) Foreign Application Priority Data

Mar. 23, 2012  (EP) .................................. 12161027

(51) Int. Cl.
*G01V 3/00*         (2006.01)
*G01R 33/32*        (2006.01)
(Continued)

(52) U.S. Cl.
CPC ........... *G01R 33/323* (2013.01); *G01R 33/10* (2013.01); *G01R 33/1284* (2013.01); *G01R 33/48* (2013.01)

(58) Field of Classification Search
USPC ........................................................ 324/309
See application file for complete search history.

(56) References Cited

U.S. PATENT DOCUMENTS 5,136,261 A * 8/1992 Lewis ....................... H03L 7/26
                                                        331/94.1
5,451,863 A * 9/1995 Freeman ................ G01R 1/071
                                                        324/754.23

(Continued)

OTHER PUBLICATIONS

M. Balabas, T. Karaulanov, M. Ledbetter, and D. Budker. Polarized alkali-metal vapor with minute-long transverse spin-relaxation time. Phys. Rev. Lett., 105:070801, 2010.

(Continued)

*Primary Examiner* — Rodney Fuller
(74) *Attorney, Agent, or Firm* — JMB Davis Ben-David

(57) ABSTRACT

A device for sensing a microwave magnetic field polarization component ($B_-$, $B_\pi$, $B_+$) of a microwave relative to a static magnetic field $B_0$, comprising a preparation means to prepare atomic vapor (10) comprising thermal atoms in a first hyperfine state, particularly a dark state to applied laser light, which first hyperfine state is split from other hyperfine state due to zero-field hyperfine splitting and/or due to a static magnetic field ($B_0$) generated by preparation means, at least one cell enclosing the thermal atoms (10), the microwave is adapted to drive Rabi oscillations of thermal atoms between first hyperfine state and second hyperfine state, Rabi frequency of Rabi oscillations being proportional to magnetic field polarization component ($B_-$, $B_\pi$, $B_+$) of the microwave, and imaging means to capture state image of plurality of atoms representing spatial atomic density distribution ($N_e$) as a function of the Rabi frequency ($\Omega_i(r)$) of Rabi oscillations.

25 Claims, 4 Drawing Sheets

Figure 1:
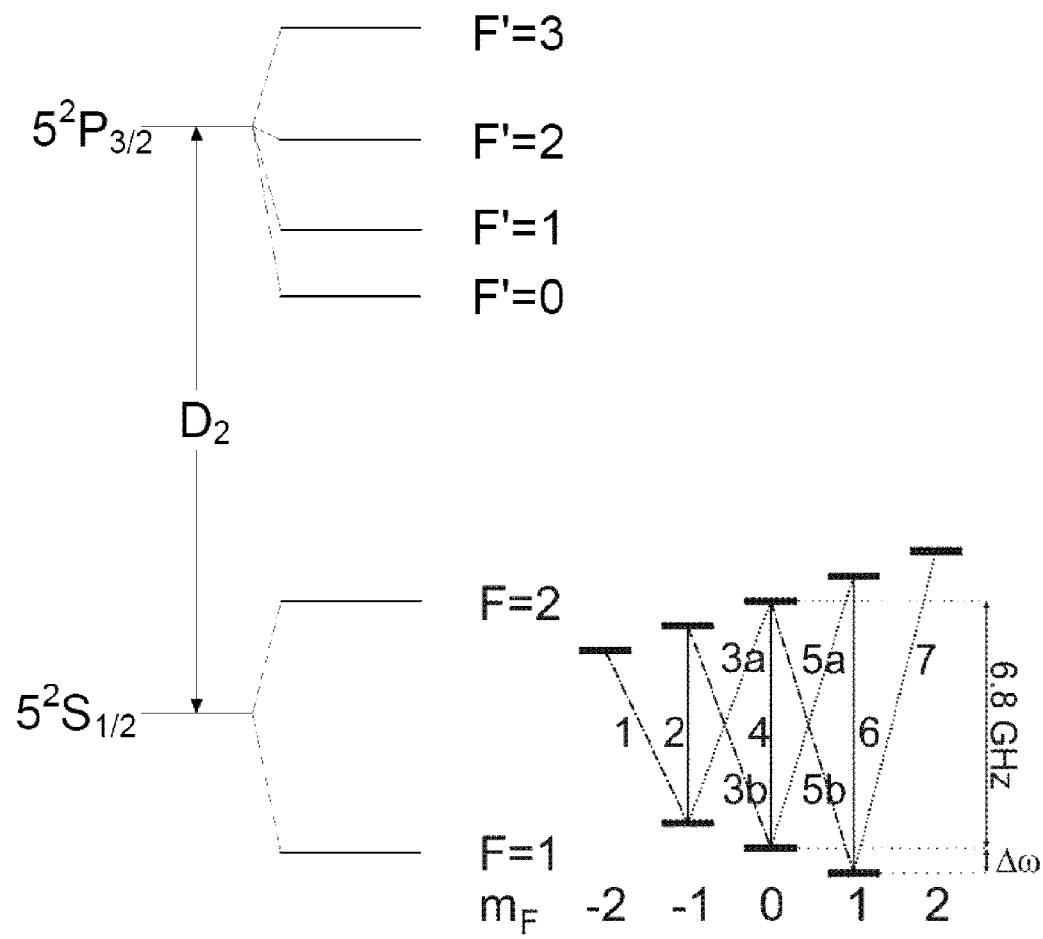

(51) Int. Cl.
G01R 33/10 (2006.01)
G01R 33/12 (2006.01)
G01R 33/48 (2006.01)

(56) References Cited

U.S. PATENT DOCUMENTS

| | | | | |
|---|---|---|---|---|
| 7,002,174 | B2* | 2/2006 | Il'ichev | B82Y 10/00 257/14 |
| 7,277,636 | B1* | 10/2007 | Gazdzinski | B82Y 10/00 398/102 |
| 8,310,230 | B2* | 11/2012 | Haensch | G01R 33/10 324/228 |
| 2010/0177317 | A1* | 7/2010 | Schwartz | G01C 19/58 356/460 |
| 2011/0234219 | A1 | 9/2011 | Boehi et al. | |
| 2015/0001422 | A1* | 1/2015 | Englund | G01N 21/6458 250/459.1 |
| 2015/0253355 | A1* | 9/2015 | Grinolds | G01R 33/022 850/40 |
| 2016/0363617 | A1* | 12/2016 | Anderson | G01R 29/0885 |
| 2017/0010338 | A1* | 1/2017 | Bayat | G01R 33/62 |

OTHER PUBLICATIONS

T. Baluktsian, C. Urban, T. Bublat, H. Giessen, R. Löw, and T. Pfau. Fabrication method for microscopic vapour cells for alkali atoms. Opt. Lett., 35(12)1950, 2010.

B. L. Bean and R. H. Lambert. Temperature dependence of hyperfine density shifts. iii. 23Na, 39K, and 85Rb in He, Ne, Ar, and N2. Phys. Rev. A, 12(4)1498, 1975.

P. Böhi, M. F. Riedel, T. W. Hänsch, and P. Treutlein. Imaging of microwave felds using ultracold atoms. Appl. Phys. Lett., 97:051101, 2010.

P. Böhi. Coherent manipulation of ultracold atoms with microwave near-fields. PhD thesis, Ludwig-Maximilians-Universität München and Max-Planck-Institut far Quantenoptik, 2010. published as MPQ report 333.

P. Böhi, M. F. Riedel, J. Hoffrogge, J. Reichel, T. W. Hänsch, and P. Treutlein. Coherent manipulation of bose-einstein condensates with state-dependent microwave potentials on an atom chip. Nature Phys., 5:592-597, 2009.

D. Budker and M. Romalis. Optical magnetometry. Nature Physics, 3:227, 2007.

A. Danielli, P. Rusian, P. Arie, M. Chou, and M. Fejer. Frequency stabilization of a frequency-doubled 1556-nm source to the 5S1/2 → 5D5/2 two-photon transitions of rubidium. Opt. Lett., 25(12):905, 2000.

D. M. Farkas, K. M. Hudek, E. A. Salim, S. R. Segal, M. B. Squires, and D. Z. Anderson. A compact, transportable, microchip-based system for high repetition rate production of bose-einstein condensates. Appl. Phys. Lett., 96:093102, 2010.

W. Franzen. Spin relaxation of optically aligned rubidium vapor. Phys. Rev. Lett., 115(4):850-858, 1959.

R. Frueholz and C. Volk. Analysis of dicke narrowing in wall-coated and buffer-gas-filled atomic storage cells. J. Phys. B: At. Mol. Opt. Phys., 18:4055-4067, 1985.

T.R. Gentile, B.J. Hughey, D. Kleppner, and T.W. Ducas. Experimental study of one- and two-photon rabi oscillations. Phys. Rev. A, 40:5103, 1989.

S. Ghosh, A. Bhagwat, C. Renshaw, S. Goh, and A. Gaeta. Low-light-level optical interactions with rubidium vapor in a photonic band-gap fiber. Phys. Rev. Lett., 97:2006, 2006.

T. Hänsch, J. Alnis, P. Fendel, M. Fischer, C. Gohle, M. Herrmann, R. Holzwarth, N. Kolachevsky, T. Udem, and M. Zimmermann. Precision spectroscopy of hydrogen and femtosecond laser frequency combs. Phil. Trans. R. Soc. A, 363:2155, 2005.

W. Ketterle, D.S. Durfee, and D.M. Stamper-Kurn. Making, probing and understanding Bose-Einstein condensates. In M. Inguscio, S. Stringari, and C.E. Wieman, editors, Bose-Einstein condensation in atomic gases, Proceedings of the International School of Physics Enrico Fermi >>, Course CXL, pp. 67-176, Amsterdam, 1999.

L. Liew, S. Knappe, J. Moreland, H. Robinson, L. Hollberg, and J. Kitching. Microfabricated alkali atom vapour cells. Appl. Phys. Lett., 84(14):2694, 2004.

P. J. Oreto, Y.-Y. Jau, A. B. Post, N. N. Kuzma, and W. Happer. Buffer-gas-induced shift and broadening of hyperfine resonances in alkali-metal vapors. Phys. Rev. A, 69:042716, 2004.

M. D. Rotondaro and G. P. Perram. Collisional broadening and shift of the rubidium D1 and D2 lines (52S1/2→52P1/2, 52P3/2) by rare gases, H2, D2, N2, CH4 and CF4. J. Quant. Spectrosc. Radial. Transfer, 57:497-507, 1997.

A. Sargsyan, C. Leroy, Y. Pashayan-Leroy, R. Mirzoyan, A. Papoyan, and D. Sarkisyan. High contrast D1 line ectromagnetically induced transparency in nanometric-thin rubidium vapor cell. preprint arXiv:1102.3824 [atom-ph], 2007.

S. Sayil, D.V. Kerns, and S.E. Kerns. A survey of contactless measurement and testing techniques. Potentials, IEEE, 24:25-28, 2005.

P. Siddons, C. Adams, C. Ge, and I. Hughes. Absolute absorption on rubidium D lines: Comparison between theory and experiment. J. Phys. B: At. Mol. Opt. Phys., 41:155004, 2008.

Bücker et al:"Single-particle-sensitive imaging of freely propagating ultracold atoms", New Journal of Physics, Institute of Physics Publishing, Bristol, GB, vol. 11, No. 10, Oct. 1, 2009, at p. 103039 (26 pp).

* cited by examiner

SIMPLE MICROWAVE FIELD IMAGING DEVICE

CROSS-REFERENCE TO RELATED APPLICATIONS

This is the U.S. National Stage of International Application No. PCT/EP2013/056172, filed Mar. 23, 2013, which was published in English under PCT Article 21(2), which in turn claims the benefit of EP Patent Application No. 12161027.3, filed Mar. 23, 2012.

The invention relates to a device for sensing (e.g. imaging) at least one microwave magnetic field polarization component of a microwave field as well as to a method for sensing such a component.

Measuring a microwave field distribution is technologically important, e.g. for the development of integrated microwave circuits, and many methods have been developed [Sayil05, Boehi10], but a really satisfactory standard technique does not exist. Recently, a new technique that uses ultracold atoms for microwave field imaging has been developed [Boehi10, BoehiThesis10] that is non-invasive, parallel and therefore fast, offers a high spatial and microwave field resolution and allows the complete reconstruction of the microwave field distribution, including the microwave phase. The technique in [Boehi10] provides very high spatial and microwave field resolution. Although recently significant progress has been made in simplifying ultracold atom experiments [Farkas09], it is still challenging to implement that method in real-life applications due to the significant technological effort needed to produce and manipulate ultracold atoms.

Therefore, based on the above, the problem underlying the present invention is to provide for a device for sensing a microwave magnetic field polarization component that is relatively easy to implement.

This problem is solved by a device having the features of claim 1.

According thereto, a device according to the invention comprises a preparation means being designed to prepare an atomic vapor comprising a plurality of thermal atoms in a (pre-defined) first hyperfine state, particularly a dark state to applied laser light, which first hyperfine state is split energetically from at least one other hyperfine state due to the zero-field hyperfine splitting and/or due to a static magnetic field $B_0$ generated by said preparation means, at least one cell for enclosing said plurality of atoms, wherein the microwave (field) comprising said magnetic field polarization component (with respect to the static magnetic field $B_0$) to be sensed (imaged), is able to drive Rabi oscillations of said plurality of thermal atoms between said first hyperfine state and a second hyperfine state, wherein the Rabi frequency of the Rabi oscillations is proportional to said magnetic field polarization component, and an imaging means being designed to generate a state image of said plurality of thermal atoms depending on the spatial atomic hyperfine state density distribution, which in turn is a function of the Rabi frequency of said Rabi oscillations and thus of said magnetic field polarization component to be imaged.

Thus, the device according to the invention is particularly able to sense/image microwaves of all kinds of (electronic) devices, for instance cell phones, conductors (wave guides) etc. The device may also be used to sense a microwave (field) that is generated at a remote place (spaced apart from the device).

According to an aspect of the invention the device may further comprise a microwave generating device (microwave source) for generating said microwave comprising said magnetic field polarization component ($B_-$, $B_\pi$, $B_+$) relative to the static magnetic field $B_0$ to be imaged, which microwave is adapted to drive Rabi oscillations of said plurality of thermal atoms between said first hyperfine state and a second hyperfine state, where the Rabi frequency is proportional to said magnetic field polarization component.

According to an aspect of the invention, such a microwave generating device (microwave source) may be particularly designed to generate microwaves having a variable frequency and/or amplitude, which can be adjusted by means of said microwave generating device.

According to a further aspect of the invention, such a microwave generating device may be designed to be connected to a separate (interchangeable) microwave device (e.g. a passive microwave device like a waveguide, for instance a coplanar waveguide, or some other passive device, into which a microwave signal is fed by the microwave generating device so as to generate the microwave field to be sensed). In this case, the microwave generating device is preferably designed such that it can be switched on and off (for instance by a controlling means connected to the microwave generating device or comprised by the latter) and allows for tuning the frequency of the generated microwaves to a desired value and/or for adjusting the amplitude of the generated microwaves to a desired value. Here, the (passive) microwave device forms the DUT ("device unter test") that exhibits the microwave field that is actually to be sensed.

Of course, also the microwave generating device being an active device may itself form said DUT (for instance in case of a cell phone forming the microwave generating device). In both cases, the DUT may be interchanged by another DUT. Thus, the device/method according to the invention is very versatile in testing microwave fields. Of course also microwaves can be tested that are generated at a remote place.

Particularly, the frequency of the generated microwave equals one of the hyperfine transition frequencies $\omega_i$ corresponding to said microwave magnetic field polarization component to be sensed, which in case the atomic vapor is formed by $^{87}$Rb atoms is given by $\omega_i = 2\pi \times 6.8$ GHz$+(i-4)\Delta\omega$ for the transition between F=1 and F=2. Here, i=1, ..., 7, $\Delta\omega$ corresponds to the Zeeman splitting induced by the static magnetic field $B_0$, and the zero-field hyperfine splitting is 6.8 GHz.

Thus, the invention particularly relies on position-resolved detection of microwave Rabi oscillations [Boehi10, Gentile89] of an ensemble of near room-temperature atoms in a vapor cell and thus particularly allows for single-shot 2D imaging and reconstruction of amplitudes (polarization components) and phases of the microwave field. Since the measured quantities only depend on the microwave field strength and well-known atomic constants, the method is intrinsically calibrated. The experimental setup/device according to the invention is much simpler than that for microwave field imaging with ultracold atoms, for instance. This makes the present device (method) promising for the characterization of microwave circuits in real-life applications.

In the present case, thermal atoms mean that the latter are approximately at temperature between 10° C. and 300° C. In an embodiment, the atoms forming the atomic vapor are preferably at room temperature, e.g. between 10° C. and 30° C., preferably between 15° C. and 25° C. In another embodiment, said atoms forming the atomic vapor are preferably heated to a temperature between 30° C. and 300° C., preferably 115° C.

Advantageously, known vapor cells can be employed within the framework of the present invention. These vapor cells have been used in diverse fields as spectroscopic reference cells [Haensch05], atomic frequency references [Danielli00] and are among the world's most sensitive magnetometers for static fields [Budker07].

According to an aspect of the invention the device comprises a controlling means being adapted to activate (deactivate) a or the microwave generating device (e.g. the microwave source) so that said microwave generated by the microwave generating device is a microwave pulse having a pre-defined duration $dt_{mw}$.

In case a microwave (field) shall be sensed that cannot be pulsed (i.e, switched on or off), for instance in case of a microwave field that is generated at a remote place, one may also control the static magnetic field $B_0$ accordingly to make the considered hyperfine transitions (Rabi oscillations) resonant with the microwave to be sensed for a pre-defined period of time.

Particularly, said plurality of thermal atoms is formed by alkali atoms, particularly $^{87}Rb$. Generally, any atomic species that shows microwave transitions that can be read out with lasers can be used.

In order to accumulate the thermal atoms forming the atomic vapor in a pre-defined first hyperfine state, said preparation means comprises a laser being adapted to illuminate said plurality of thermal atoms (for a first optical pumping period $dt_{pump}$) according to a further aspect of the present invention. Particularly, in case said plurality of thermal atoms is formed by $^{87}Rb$ atoms said laser is adapted to illuminate the $^{87}Rb$ atoms by laser light having a wavelength being resonant with the $D_2$ transition of $^{87}Rb$ from F=2 to F'=1 or 2 such that the excited $^{87}Rb$ atoms consequently decay into the first hyperfine state F=1, which is a dark state to said laser light.

Particularly, the controlling means is designed to activate the laser while the microwave generating device (microwave source) is switched off (i.e. said microwave to be sensed is not present), wherein particularly said first optical pumping period $dt_{pump}$ has a length within the range from 100 µs to 10 s, particularly 100 ms.

According to a further aspect of the invention, the imaging means is designed to capture an absorption image or a fluorescence image as said state image, namely by means of said laser being adapted to shine a laser pulse of a pre-defined duration $dt_{img}$, particularly having a length ranging from 5 µs to 15 µs, particularly 10 µs, on the plurality of thermal atoms, so as to excite said atoms from the second hyperfine state to an excited state. In case said plurality of thermal atoms is formed by $^{87}Rb$ atoms said laser is particularly adapted to shine a laser pulse of said pre-defined duration being resonant with the $D_2$ transition of $^{87}Rb$ from F=2 to F'=3. For imaging the shadow cast by the resonant atoms excited by said laser pulse (absorption image) or the fluorescence of the resonant atoms excited by said laser pulse (fluorescence image), the imaging means preferably comprises a camera (CCD camera). Further, controlling of the laser can be done by the controlling means being adapted to activate (deactivate) the laser for generating said laser pulse of said pre-defined duration $dt_{img}$.

For retaining the microwave generating device and/or a microwave device (see above) with respect to the at least one cell such that a microwave (field) generated by said microwave generating device that is to be tested penetrates said at least one cell so as to interact with said plurality of atoms, the device preferably comprises a support, which is preferably adapted to allow for displacing the microwave generating device and/or microwave device along a direction normal to an extension plane of the cell. Particularly, the at least one cell encloses a flat inner space extending along said extension plane for receiving the atomic vapor (i.e. the inner space has a shape that is essentially two-dimensional, wherein the dimension of said inner space normal to said extension plane is much smaller than along said extension plane). Hence, by displacing the microwave generating device and/or microwave device normal to the extension plane of the cell allows for three-dimensional imaging of the microwave field.

According to a further aspect of the invention, the preparation means for preparing the atomic vapor comprises a static magnetic field generating means being adapted to generate said static magnetic field for splitting the atomic hyperfine states in transition frequency, wherein particularly said magnetic field generating means allows for generating the static magnetic field along any desired direction. This may be achieved for instance by using three pairs of Helmholtz coils that may be oriented along three orthogonal axes. Of course, the transition frequencies $\omega_i$ between the split hyperfine states F=1 and F=2 (see above) can be tuned by means of the static magnetic field such that different frequencies of the generated microwave field or different microwave (generating) devices can be probed.

According to yet another aspect of the invention the device may comprise a heating means such as an oven for heating said plurality of atoms residing in the at least one cell so as to adjust the pressure of the atomic vapor formed by the plurality of atoms. Preferably the heating means is particularly designed to adjust the temperature of the cell (i.e. of the atomic vapor residing therein) to the temperatures stated above. In an embodiment of the invention, the heating means is formed as an oven enclosing the at least one cell.

Further, the device according to the invention preferably comprises a vacuum pump connected to the at least one cell for evacuating the at least one cell.

The atoms constituting the atomic vapor inside the at least one cell may be stored in an atomic reservoir connected to the at least one cell. Alternatively, said atoms may be directly deposited in the at least one cell, for instance in a first recess of the at least one cell.

According to a further aspect of the invention, also a buffer gas is provided in the at least one cell for slowing down the atoms (e.g. $^{87}Rb$), thus providing higher spatial resolution and/or reducing Doppler broadening of the microwave transition. Therefore, the at least one cell is preferably connected to a buffer gas reservoir (for instance via a valve) containing buffer gas atoms for forming said buffer gas. Alternatively, said buffer gas atoms may be directly deposited in the at least one cell, particularly in a second recess (hole) of the at least one cell. Preferably, said atoms for forming a buffer gas are noble gas atoms, particularly neon.

Further, in order to increase maintenance of the hyperfine states of the atoms forming the atomic vapor when these atoms collide with an inside of the at least one cell, the latter is preferably coated with a suitable material such as alkene or paraffin.

This is especially useful when confining the atomic vapor in a plurality of cells (particularly of the afore-mentioned kind) forming a two-dimensional array, particularly a micro-machined array of cells, wherein the plurality of cells is particularly formed into a substrate, particularly a glass substrate. Here, Doppler broadening may be reduced due to reflections of the individual atoms in opposite directions in the relatively small cells (having a diameter in the μm range).

In such an array, individual cells may be connected by conduits (e.g. trenches in said substrate) so as to allow for introducing atoms for forming the atomic vapor into the cells from a single atomic reservoir and/or so as to allow for introducing buffer gas atoms as described above into the cells from a single buffer gas reservoir. Alternatively, the afore-mentioned atoms may also be directly deposited into the cells, for instance upon fabrication of the latter.

According to a further idea according to the invention, the static magnetic field generating means and the array of cells are integrated into a single chip.

Further, the problem according to the invention is solved by method for sensing (imaging) at least one microwave magnetic field polarization component of a microwave (field) having the features of claim 22, wherein particularly a device according to the invention is used for conducting this method. The method comprises the steps of: preparing an atomic vapor comprising a plurality of thermal atoms in a pre-defined first hyperfine state particularly a dark state to applied laser light, e.g. in a static magnetic field such that the transition from the first to a second hyperfine state is split by the static field and/or the zero-field hyperfine splitting, generating a microwave (field) comprising said magnetic field polarization component to be sensed (imaged) (e.g. by means of a microwave generating device) so that the microwave drives Rabi oscillations of said plurality of thermal atoms between said first hyperfine state and a second hyperfine state, which Rabi oscillations are proportional to said magnetic field polarization component, and generating a state image of said plurality of atoms depending on the spatial atomic density distribution being a function of the Rabi frequency of said Rabi oscillations and thus of said magnetic field polarization component to be imaged.

Particularly, the frequency of the generated microwave equals one of the hyperfine transition frequencies $\omega_i$, corresponding to said microwave magnetic field polarization component to be sensed, which in case the atomic vapor is formed by $^{87}$Rb atoms is given by $\omega_i=2\pi\times6.8$ GHz$+(i-4)\Delta\omega$ for the transition between F=1 and F=2. Here, i=1, ..., 7, $\Delta\omega$ corresponds to the Zeeman splitting induced by the static magnetic field $B_0$, and the zero-field hyperfine splitting is 6.8 GHz.

Preferably, said plurality of thermal atoms is formed by alkali atoms, particularly $^{87}$Rb. For gathering the atoms of the atomic vapor in a first pre-defined hyperfine state said atoms are excited with laser light during a first optical pumping period $dt_{pump}$, wherein particularly in case said plurality of thermal atoms is formed by $^{87}$Rb atoms said laser light has a wavelength being resonant with the $D_2$ of $^{87}$Rb transition from F=2 to F'=1 or 2 such that the excited $^{87}$Rb atoms consequently decay into the first hyperfine state F=1 being a dark state to said laser light. Particularly said optical pumping period has a length as stated above.

According to an aspect of the invention said microwave is generated as a microwave pulse having a pre-defined duration, e.g. by employing a microwave generating device that is automatically activated such that the generated microwave is a microwave pulse having a pre-defined duration (see above).

In order to generate said state image, absorption or fluorescence imaging techniques may be employed. Therefore a laser pulse of a pre-defined duration $dt_{img}$ is directed onto the atomic vapor (see above), which laser pulse is adapted to be resonant with a transition from e.g. the second hyperfine state to an excited state, wherein particularly in case said plurality of thermal atoms is formed by $^{87}$Rb atoms said laser pulse of said pre-defined duration $dt_{img}$ is resonant with the transition of $^{87}$Rb from F=2 to F'=3, wherein the shadow cast by the resonant atoms (or the fluorescence of the resonant atoms) excited by said laser pulse is captured by a camera (CCD camera).

According to a further aspect of the invention, atomic vapor residing in a plurality of cells (see above) may be simultaneously driven to perform Rabi oscillations. The steps as described above may then be carried out simultaneously for the plurality of cells. This allows one to achieve a micrometer-scale spatial resolution of the microwave field to be sensed (imaged).

Further, in order to extract said microwave magnetic field polarization component from a single state image, the Rabi frequency $\Omega_i(r)$ of the Rabi oscillations may be determined using a function of the form $$N_e = N\,\sin^2\!\left(\tfrac{1}{2}\Omega_i(r)dt_{mw}\right)$$

where $N_e$ is the measured density of atoms transferred by the microwave to the second hyperfine state and N is proportional to the density of atoms in the vapor cell. The Rabi frequency $\omega_i(r)$ can be determined up to an offset $n\pi/dt_{mw}$, n being an integer, wherein said offset for each of said data points is determined by means of a ray tracing method in which rays are considered from the state image's periphery where $\Omega_i(r)dt_{mw}\ll1$ through the desired data point to a point (e.g. center) of the state image (microwave structure) where $\Omega_i(r)$ is maximal. Said integer n is then given by the sum of the number of minima and maxima of $N_e$ encountered along said ray.

Alternatively, a sequence of k state images may be captured for different power $P_{mw}$ of the microwave and/or different durations of the microwave pulse $dt_{mw}$ in order to obtain a sequence of k data points for each pixel of the state images showing Rabi oscillations, wherein particularly a function of the form $N_e/N$ (see above) is then fit to said data points. From said fit, $\Omega_i(r)$ is determined and therefrom $B_i$ at the respective pixel for a given power $P_{mw}$.

Figure 2:
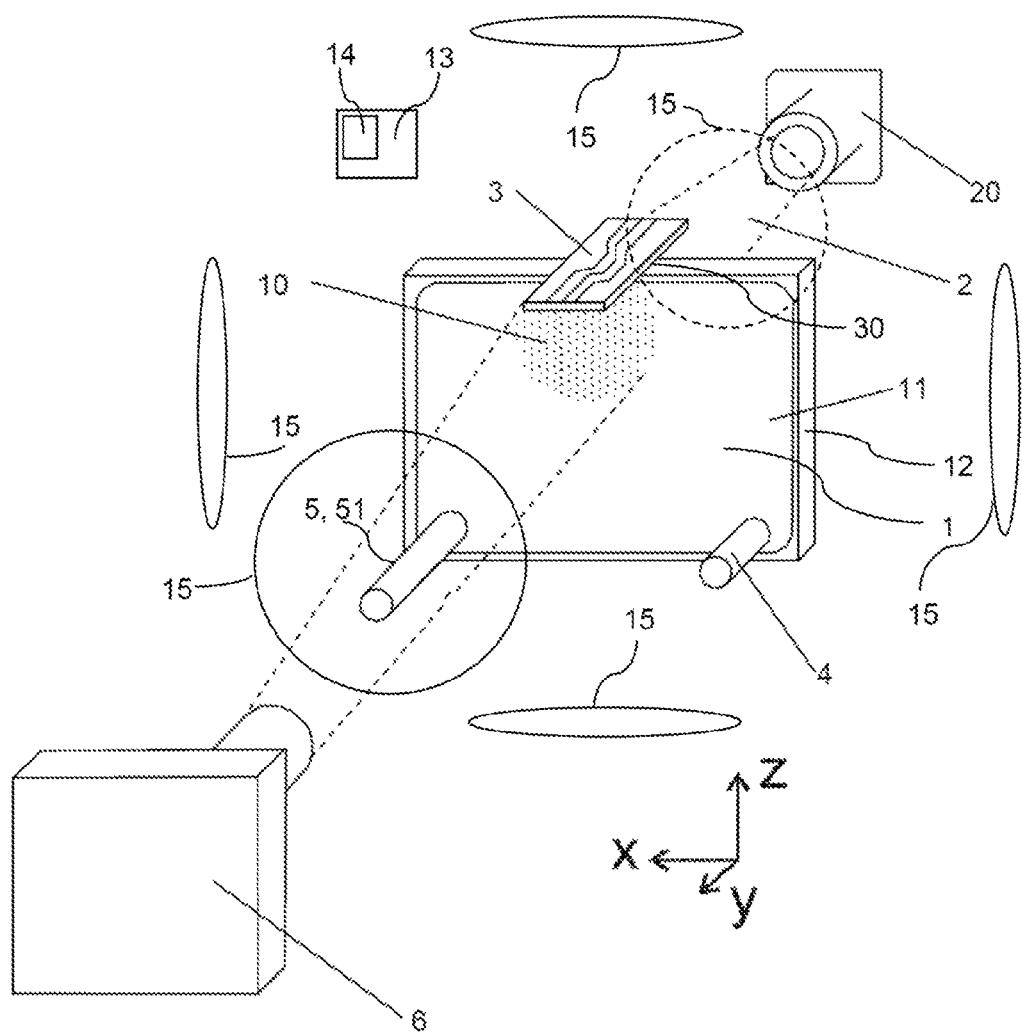
Figure 3:
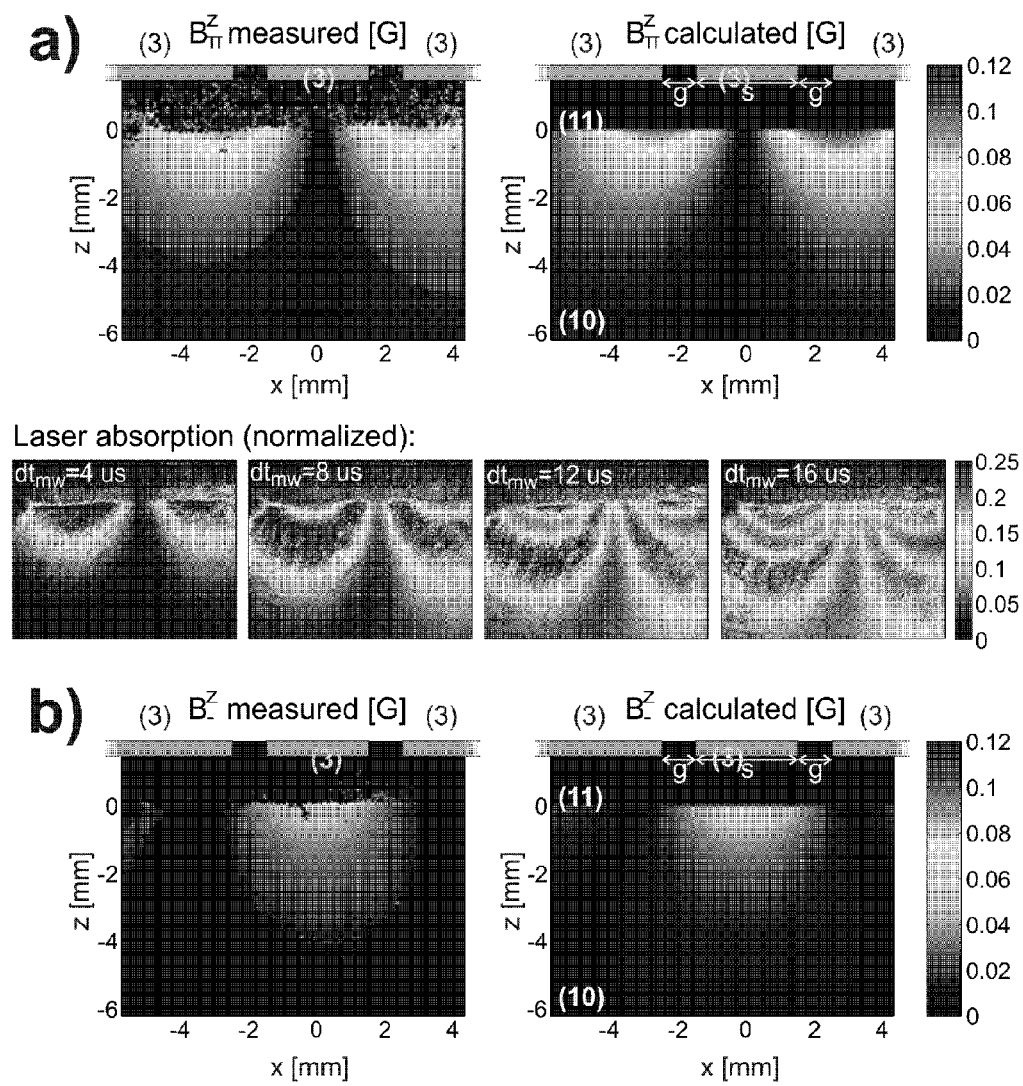
Figure 4:
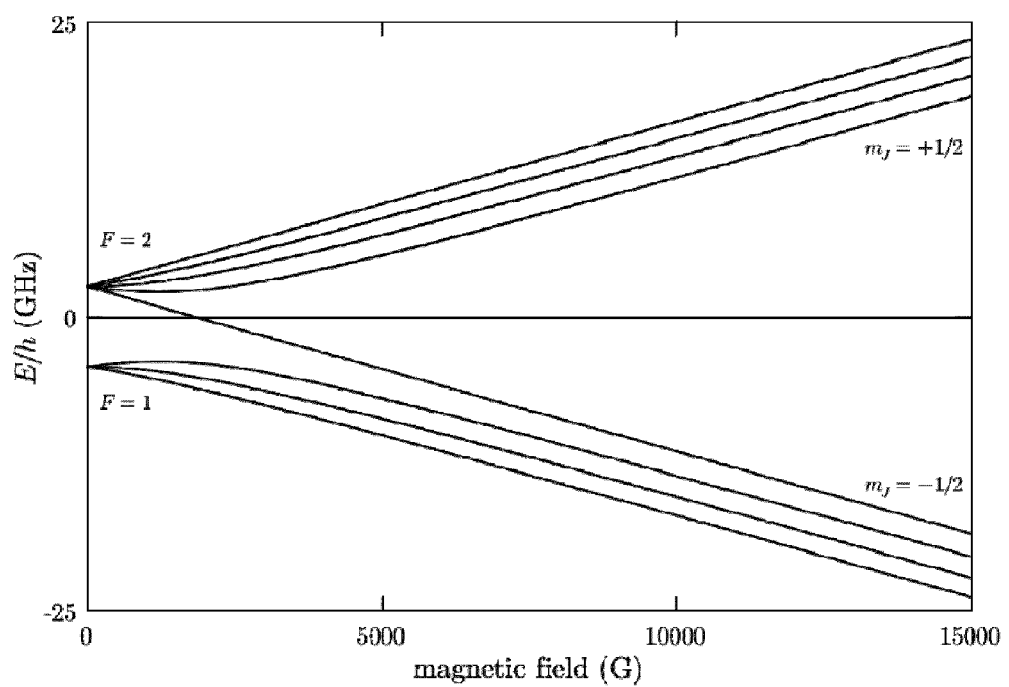

Further features and advantages of the invention shall be described by means of a detailed description of embodiments with reference to the Figures, wherein FIG. 1 shows the $D_2$ transition and hyperfine structure of $^{87}$Rb that may be used within the framework of the present invention, FIG. 2 shows a schematical view of a device (setup) according to the invention, FIG. 3 shows an overview of the measured spatial distribution of two selected microwave magnetic field components around a microwave device in the form of an (interchangeable) coplanar waveguide (CPW) and comparison to a simulation, and FIG. 4 shows the hyperfine levels of $^{87}$Rb as a function of the static magnetic field $B_0$.

The device and method according to the invention may work as indicated in FIG. 2. According thereto a vapor cell 1 is connected to an atomic reservoir 4, a vacuum pump 5 and a buffer gas reservoir 51. In the specific example according to FIG. 2 a thermal atomic vapor of $^{87}$Rb atoms and a Neon buffer gas is used. In general, any atomic species that has microwave transitions that can be read out with lasers can be used (e.g. other alkali atoms). The vapor cell 1 has a 2D geometry (i.e. is much thinner than wide) extending along an extension plane (x-z plane) to allow the collection of a 2D image of the microwave field. Along the propagation direction of a laser beam 2 for exciting the atomic vapor (see below) the 2D vapor cell 1 has an interior thickness of 3 mm.

On the top of the vapor cell 1, the microwave device 3 to be characterized is mounted at an outside of the cell 1 on a support 30 (e.g. translation stage) that allows to move it along the y direction normal to said extension plane of the cell 1. The microwave device 3 is coupled to a microwave generating device (microwave source) 13 generating the microwaves to be examined at the microwave device 3. As shown in FIG. 2 such a device may be a coplanar waveguide (CPW) or any other device comprising a microwave field (FIG. 2 merely shows the microwave device in the form of a CPW). The microwave generating device 13 may comprise or may be connected to a controlling means 14 for activating the microwave generating device 13.

In this way, 2D images of the microwave field can be taken in any desired cross-section of the microwave device 3. The vapor cell 1 is surrounded by three pairs of Helmholtz coils 15 oriented along the x, y, and z axes. The coils 15 can be used to apply a static magnetic field $B_0$ along any desired direction. The vapor cell 1 is inside an oven 12. The oven 12 has two opposing windows facing each other along the y direction for optical access and optical readout. The inside of the oven 12 is at a temperature of typically 115° C. to increase the Rb vapor pressure, which improves the laser absorption signal to be detected. It is to be noted that the operation of the device according to the invention is also possible at ambient temperature (without the oven), albeit at a lower signal to noise level. During the whole sequence a non-vanishing static magnetic field $B_0$ is maintained, which splits the hyperfine transition frequencies $\omega_i$ by $$\Delta\omega = \frac{\mu_B B_0}{2\hbar}.$$

During a first optical pumping period $dt_{pump}$~100 ms the Rb-vapor is illuminated by laser light 2 at 780 nm generated by the laser 20 and resonant with the $D_2$ transition $F=2\leftrightarrow F'=3$ of $^{87}$Rb, which is shown in FIG. 1. In the notation $5^2S_{1/2} \rightarrow 5^2P_{3/2}$ the first number states the principal quantum number of the outer electron, the superscript is 2S+1 (S is the spin angular momentum), wherein the letter refers to the orbital angular momentum L (i.e., $S \leftrightarrow L=0$, $P \leftrightarrow L=1$, etc.), and the subscript states the value of J (total electron angular momentum with J=S+L, where S is the spin angular momentum). The hyperfine structure is the result of the coupling of J with the total nuclear angular momentum I. The total atomic angular momentum F is then given by F=J+I, wherein the magnitude of F can range between $|J-I| \leq F \leq J+I$. For the $^{87}$Rb ground state one has J=1/2 and I=3/2 so that F=1 or F=2. For the excited state of the $D_2$ line ($5^2P_{3/2}$), F can take any of the values F'=0, 1, 2, or 3.

Due to the Doppler broadening of the atomic transition (~0.5 GHz), atoms can also get excited to levels F'=2 and F'=1 upon said optical pumping from which they can consequently decay into the dark state F=1, where they accumulate. After that, the laser 20 is switched off and the microwave generating device connected to the microwave device 3 is simultaneously pulsed on for a duration $dt_{mw}$ at a frequency $\omega_{mw}$, which is equal to one of the atomic hyperfine transition frequencies $\omega_i$ (i=1-7) between F=1 and F=2 (see FIG. 1). For $B_0<1000$ G and $^{87}$Rb atoms, the transition frequencies are approximately given by $\omega_i=2\pi\times 6.8$ GHz+(i−4)$\Delta\omega$.

The microwave drives Rabi oscillations on the corresponding resonant transition(s) at the Rabi frequencie(s) $\Omega_i(r)$. In this respect, FIG. 1 shows the hyperfine level scheme of $^{87}$Rb for F=1 and F=2 in a static magnetic field ($B_0 \ll 1000$ G). The different transitions (1-7) are indicated (transition frequencies $\omega_i$), wherein the transitions 3a+b and 5a+b are degenerate.

On the non-degenerate transitions (i=1, 2, 4, 6 and 7), the number of atoms transferred to F=2 after the microwave pulse is given by $$N_e = N \sin^2\left(\frac{1}{2}\Omega_i(r)dt_{mw}\right)$$

where N is a constant proportional to the density of atoms in the vapor cell 1. On the degenerate transitions (3a+b, 5a+b), two sinusoidal Rabi oscillations of different frequency contribute to $N_e$. In the following, we concentrate on the non-degenerate transitions. After the microwave pulse, the spatial distribution of $\Omega_i(r)$ is imprinted into the spatial hyperfine state distribution $N_e(r)$ of the atoms. This spatial atomic density distribution $N_e(r)$ is then measured by shining in a laser pulse 2 of duration $dt_{img}$~10 μs resonant with $F=2\leftrightarrow F'=3$ and by imaging the shadow cast by the resonant atoms with a CCD camera 6. Examples of such images are shown in FIG. 3. Therein the reference numeral (3) denotes the position of the microwave device to be tested being a coplanar wave guide (CPW) having a central contact of width s separated by two recesses of width g from lateral contacts of the CPW.

As already mentioned, quantitative data extraction can be done for instance by measuring $N_e(r)$ for varying values of the microwave power $P_{mw}$ ($\Omega_i \propto \sqrt{P_{mw}}$) and/or $dt_{mw}$ and extracting $\Omega_i(r)$ from the data by fitting [Boehi10].

The Rabi frequencies $\Omega_i(r)$ are proportional to a specific (polarization) component of the local microwave magnetic field $B(r,t)=1/2[B(r)e^{-i\omega_{mw}t}+B^*(r)e^{i\omega_{mw}t}]$ with respect to $B_0$, $$\Omega_1(r) = -\sqrt{3}\frac{\mu_B}{\hbar}B_-(r)e^{-i\phi_-(r)} \quad [1]$$

$$\Omega_2(r) = -\sqrt{\frac{3}{4}}\frac{\mu_B}{\hbar}B_\pi(r)e^{-i\phi_\pi(r)} \quad [2]$$

$$\Omega_4(r) = -\frac{\mu_B}{\hbar}B_\pi(r)e^{-i\phi_\pi(r)} \quad [3]$$

$$\Omega_6(r) = -\sqrt{\frac{3}{4}}\frac{\mu_B}{\hbar}B_\pi(r)e^{-i\phi_\pi(r)} \quad [4]$$

$$\Omega_7(r) = \sqrt{3}\frac{\mu_B}{\hbar}B_+(r)e^{-i\phi_+(r)} \quad [5]$$

Here, $B_\pi$ and $\varphi_\pi$ are the real-valued amplitude and phase of the component of B parallel to $B_0$, and $B_+$, $\varphi_+$ ($B_-$, $\varphi_-$) are the corresponding quantities for the right-handed (left-handed) circular polarization component in the plane perpendicular to $B_0$ (see supplement of [Boehi10] for more details; the equations above are valid for small magnetic fields $B_0$ up to ~1000 G). Similar relations exist for $\Omega_{3a+b}$ and $\Omega_{5a+b}$, but they are more complicated to extract from the data while not providing more information than $\Omega_{1,2,3,6,7}$.

Having measured $B_\pi$, $B_+$ and $B_-$ for $B_0$ along x, y and z, B can be fully reconstructed, including microwave phases, see also the detailed description of [Boehi10] which can also be employed in the present case.

EXAMPLES

Measurements of the spatial distribution of two exemplary microwave magnetic field components near a coplanar waveguide (CPW) and comparison to a simulation [Boehi09] are shown in FIG. 3.

Here, a 10 mbar Ne buffer gas has been used (see later) and $dt_{mw}$ has been varied between 1 and 30 μs. After optical pumping at a pump laser intensity I with $I/I_{sat}$~0.1 ($I_{sat}$ the so called saturation intensity, which for $^{87}$Rb on the D2 transition for circularly polarized light is given by $I_{sat}$=1.7 mW/cm$^2$,), the Rb vapor at 115° C. exhibits an optical density [Ketterle99] of ~0.5. The application of the microwave pulse leads to a modulation of the optical density with an amplitude of up to 30%, depending on the microwave transition chosen. The smallest spatial structures of the microwave field distribution that can be clearly resolved have a size of a few hundred micrometers, e.g. 350 μm for $dt_{mw}$=16 μs.

In the two upper panels of FIG. 3 the distribution of $B_\pi^z$, i.e. the $B_\pi$ polarization component for $B_0$ pointing along z (left hand side) and a simulation of said component is shown (right hand side). For these measurements, we probed the microwave transition $|F,m_F\rangle=|1,0\rangle \rightarrow |2,0\rangle$ at $B_0$=1.5 G. On top of the vapor cell, the CPW is indicated (s=3 mm and g=1 mm). The ground wires have a width of 8 mm each. The four panels beneath the two upper panels show raw data of the relative laser light absorption $$\frac{I_0 - I_{mw}}{I_0}$$

due to Rabi oscillations for various values of $dt_{mw}$, which were used to extract $B_\pi^z$ (with $I_0$ the light intensity impinging on the vapor cell and $I_{mw}$ the light transmitted through the Rb vapor).

The lower two panels show the measured distribution of $B_-^z$ (left hand side) and a comparison to a simulation (right hand side). Here, we probed the microwave transition $|1,-1\rangle \rightarrow |2,-2\rangle$. (10) indicates the Rb vapor inside the glass cell and (11) is a glass wall of the cell 1 delimiting said cell 1.

A question that arises is how imaging microwave fields with near room-temperature atoms compares to using ultracold atoms. Using thermal instead of ultracold atoms as in [Boehi10] has the following consequences: First, thermal atoms move much faster than ultracold atoms (for rubidium, the mean thermal velocity at 300 K, is $$\bar{v}_{th,300\,K} \sim 300 \frac{m}{s}$$

instead of only $$\bar{v}_{th,8\,\mu K} \sim 5 \frac{cm}{s}$$

for a temperature of 8 μK), limiting the spatial resolution $s_{res}$ for a given microwave field resolution which in turn is determined by the microwave interaction time $dt_{mw}$. Second, by using thermal instead of ultracold atoms, the microwave transition frequencies $\omega_i$ are Doppler broadened by $$\Delta\omega_{Doppler} = \frac{\bar{v}_{th,300\,K}}{c}\omega_{hfs} \sim 2\pi \times 6.8 \text{ kHz},$$

with c the speed of light. The lowest $B_\gamma$ ($\gamma=-,\pi$ or $+$) that drives coherent Rabi oscillations has to generate a Rabi frequency $\Omega_i$ on the order of $\Delta\omega_{Doppler}$, corresponding to a microwave magnetic field amplitude $B_\gamma$ of ~5 mG.

There are ways to relax both restrictions: One way to 'effectively' slow down the atoms is using a heavy, noble buffer gas like neon, argon, krypton or xenon [Franzen59] to change the Rb motion from the ballistic to the diffusive regime. Neon is particularly well suited since the cross section for collisional depolarization between Rb and Ne is very small (5.2×10$^{-23}$ cm$^2$ [Franzen59]). Using e.g. 10 mbar of neon buffer gas, the rubidium atoms diffuse a distance of ~430 μm in 30 μs [Franzen59], which has to be compared with 9 mm of ballistic motion for the case without buffer gas. The presence of buffer gas does not only improve the spatial resolution but also enhances the microwave field sensitivity. Even for small buffer gas pressures, the mean free path length $l_{mfp}$ for a Rb atom gets much smaller than the microwave wavelength $\lambda_{mw}$. Thus, we enter the regime of Dicke narrowing [Frueholz85] where the microwave Doppler shifts seen by the atoms during their diffusive motion effectively cancel, such that the microwave resonances $\omega_i$ can be as narrow as 20 Hz [Frueholz85]. A slight drawback of this slowing down is that the presence of buffer gas leads to line shifts and broadening of the optical [Rotondaro97] and line shifts of the microwave transition frequencies $\omega_i$ [Bean75, Oreto04]. Furthermore, the absorption of the Rb vapor decreases [Rotondaro97]: with 10 mbar Ne buffer gas and $I/I_{sat}$=0.1 we measure an optical density of the Rb vapor of 0.5 after $dt_{pump}$. Without buffer gas and $I/I_{sat}$~0.1 ($I/I_{sat}$~0.01), we measure an optical density of 4.2 (5.4).

It has been observed before that the presence of Ne buffer gas leads to a decrease of the atomic absorption [Rotondaro97], but the drop in absorption measured in our example is much higher than reported in ref. [Rotondaro97]. The reason for this is not fully understood, but the lowered absorption enhances the signal seen by our camera, while at the same time benefiting from increased spatial resolution due to the buffer gas. A higher absorption allows the construction of thinner devices. Furthermore, the laser absorption can be adjusted very well via the Rb vapor pressure, which in turn has a strong dependence on the cell temperature. The pump laser polarization is circular, but it turned out only to be of significance for quantization fields $B_0$ pointing along the laser direction with $B_0 \geq 10$ G.

Another possibility to simultaneously get good spatial and microwave sensitivity with thermal atoms would be to confine the atoms in an array of micromachined cells, e.g. fabricated into a glass substrate, similar to references [Baluktsian10, Liew04]. Normally, the rubidium atom's hyperfine state is lost after one collision with the confining glass wall [Franzen59, Sargsyan11]. Using recently developed alkene coatings as in [Balabas10a], the atom's hyperfine state survives up to 10$^6$ atom-wall collisions without change, increasing the maximum interaction time $dt_{mw}$ for a given resolution by a factor 10$^6$ as compared to the case without micromachined cells and without buffer gas. This increases the microwave sensitivity by the same factor. Since the length of such a miniature cell would typically be some µm, and therefore much less than $\lambda_{mw}$, also in this situation we benefit from Dicke narrowing [Frueholz85]. The Dicke narrowing in a coated cell can be even more efficient than using buffer gas since the atoms have a high probability of being reflected from a cell wall with the same velocity but in opposite direction, which leads to very good cancelation of the Doppler shift. This way, clearly resolvable Rabi oscillations whose frequency is equal to a Dicke-narrowed linewidth of 20 Hz are achievable [Frueholz85]. Such a Rabi frequency is caused by a microwave magnetic field amplitude of only $B_r \sim 10^{-5}$ G. The only drawback of coated cells is that the temperature tuning range of the cells and therefore the tuning range of the vapor pressure becomes limited [Balabas10], because melting of the coating has to be avoided.

A small amount of Rb (or other alkali atoms) could be deposited in each microcell during fabrication. The Rb vapor density could then be controlled by temperature or by light-induced desorption as in [Ghosh06]. Alternatively, the different microcells could be connected by thin trenches in the substrate to allow atoms to be introduced into such a system from a single reservoir as in the present example. It is also possible to effectively slow down the atoms by using micromachined holes filled with buffer gas [Liew04].

We now estimate the microwave field sensitivity that can be obtained with such microcells. Assuming a photon-shot-noise-limited imaging system and $$dt_{im} = 10 \ \mu s,$$

the smallest optical density change that can be resolved on a pixel of area $$A = d^2 \text{ is } \Delta OD_{min} = \sqrt{\hbar \omega_L / I_0 A dt_{im}} = 0.02,$$

where $\omega_L$ is the laser frequency, $I_0 = 0.2$ mW/cm$^2$, and d=5 µm. This implies that a Rabi frequency as small as $$\omega_{min} \approx (2/dt_{mw})\sqrt{\Delta OD_{min}/OD} = 2\pi \times 9 \text{ kHz}$$

could be detected in a single shot (OD=0.2, $dt_{mw}$=13 µs). This corresponds to a microwave magnetic field amplitude of a few hundred nT, which arises, e.g., at a distance of 5 µm from a microwave guide carrying a signal of $P_{mw} \approx 7$ nW. In general, a higher spatial resolution implies a lower microwave field resolution, because both the maximal $dt_{mw}$ is shorter and the area A over which the image is integrated is smaller.

The method and device according to the invention presented here is not restricted to fixed frequencies. Instead, the transition frequencies $\omega_i$ can be tuned via the static magnetic field $B_0$. Using magnetic fields of up to 1.6 T, which is the saturation magnetic field of neodymium magnets, the transition frequencies can be tuned to up to 50 GHz for $^{87}$Rb, see FIG. 4 showing the hyperfine levels of $^{87}$Rb as a function of static magnetic field $B_0$. For large $B_0$, transition frequencies in the range of several tens of GHz are accessible. With magnetic fields $B_0$>1000 G, we start entering the Paschen-Back regime, where the matrix elements of Eqns. [1-5] change. Nevertheless, a full reconstruction of the microwave field is possible. At the low-frequency end, the zero-field hyperfine splitting sets a limit on the microwave transition frequencies. Atoms with smaller hyperfine splitting such as $^{85}$Rb (3.0 GHz) or $^{39}$K (0.5 GHz) allow one to access the regime of low frequencies.

Furthermore, readout does not necessarily have to rely on absorption imaging, but could equally well be done using fluorescence imaging [Ketterle99].

The simplicity of the present method allows for the construction of integrated microwave field imaging devices. Preferably, such a device consists of micromachined cells [Baluktsian10] and integrated electro magnets to tune the transition frequencies to the desired values.

REFERENCES

[Sayil05] S. Sayil, D. V. Kerns, and S. E. Kerns. *A survey of contactless measurement and testing techniques*. Potentials, IEEE, 24:25-28, 2005.

[Boehi10] P. Böhi, M. F. Riedel, T. W. Hänsch, and P. Treutlein. *Imaging of microwave felds using ultracold atoms*. Appl. Phys. Lett., 97:051101, 2010.

[BoehiThesis10] P. Böhi. *Coherent manipulation of ultracold atoms with microwave near-fields*. PhD thesis, Ludwig-Maximilians-Universität München and Max-Planck-Institut für Quantenoptik, 2010. published as MPQ report 333.

[Farkas09] D. M. Farkas, K. M. Hudek, E. A. Salim, S. R. Segal, M. B. Squires, and D. Z. Anderson. *A compact, transportable, microchip-based system for high repetition rate production of bose-einstein condensates*. Appl. Phys. Lett., 96:093102, 2010.

[Haensch05] T. Hänsch, J. Alnis, P. Fendel, M. Fischer, C. Gohle, M. Herrmann, R. Holzwarth, N. Kolachevsky, T. Udem, and M. Zimmermann. *Precision spectroscopy of hydrogen and femtosecond laser frequency combs*. Phil. Trans. R. Soc. A, 363:2155, 2005.

[Danielli00] A. Danielli, P. Rusian, A. Arie, M. Chou, and M. Fejer. *Frequency stabilization of a frequency-doubled 1556-nm source to the $5S_{1/2} \rightarrow 5D_{5/2}$ two-photon transitions of rubidium*. Opt. Lett., 25(12):905, 2000.

[Budker07] D. Budker and M. Romalis. *Optical magnetometry*. Nature Physics, 3:227, 2007.

[Gentile89] T. R. Gentile, B. J. Hughey, D. Kleppner, and T. W. Ducas. *Experimental study of one-and two-photon rabi oscillations*. Phys. Rev. A, 40:5103, 1989.

[Ketterle99] W. Ketterle, D. S. Durfee, and D. M. Stamper-Kurn. *Making, probing and understanding Bose-Einstein condensates*. In M. Inguscio, S. Stringari, and C. E. Wieman, editors, Bose-Einstein condensation in atomic gases, Proceedings of the International School of Physics "Enrico Fermi", Course CXL, pages 67-176, Amsterdam, 1999.

[Franzen59] W. Franzen. *Spin relaxation of optically aligned rubidium vapor*. Phys. Rev. Lett., 115(4):850-858, 1959.

[Boehi09] P. Böhi, M. F. Riedel, J. Hoffrogge, J. Reichel, T. W. Hänsch, and P. Treutlein. *Coherent manipulation of bose-einstein condensates with state-dependent microwave potentials on an atom chip*. Nature Phys., 5:592-597, 2009.

[Frueholz85] R. Frueholz and C. Volk. *Analysis of dicke narrowing in wall-coated and buffer-gas-filled atomic storage cells*. J. Phys. B: At. Mol. Opt. Phys., 18:4055-4067, 1985.

[Rotondaro97] M. D. Rotondaro and G. P. Perram. *Collisional broadening and shift of the rubidium D1 and D2 lines ($5^2S_{1/2} \rightarrow 5^2P_{1/2}, 5^2P_{3/2}$) by rare gases, $H_2$, $D_2$, $N_2$, $CH_4$ and $CF_4$*. J. Quant. Spectrosc. Radiat. Transfer, 57:497-507, 1997.

[Bean75] B. L. Bean and R. H. Lambert. *Temperature dependence of hyperfine density shifts. iii. $^{23}$Na, $^{39}$K, and $^{85}$Rb in He, Ne, Ar, and $N_2$*. Phys. Rev. A, 12(4):1498, 1975.

[Oreto] P. J. Oreto, Y.-Y. Jau, A. B. Post, N. N. Kuzma, and W. Happer. *Buffer-gas-induced shift and broadening of hyperfine resonances in alkali-metal vapors*. Phys. Rev. A, 69:042716, 2004.

[Siddons08] P. Siddons, C. Adams, C. Ge, and I. Hughes. *Absolute absorption on rubidium D lines: Comparison between theory and experiment*. J. Phys. B: At. Mol. Opt. Phys., 41:155004, 2008.

[Baluktsian10] T. Baluktsian, C. Urban, T. Bublat, H. Giessen, R. Löw, and T. Pfau. *Fabrication method for microscopic vapour cells for alkali atoms*. Opt. Lett., 35(12): 1950, 2010.

[Liew04] L. Liew, S. Knappe, J. Moreland, H. Robinson, L. Hollberg, and J. Kitching. *Microfabricated alkali atom vapour cells*. Appl. Phys. Lett., 84(14):2694, 2004.

[Sargsyan07] A. Sargsyan, C. Leroy, Y. Pashayan-Leroy, R. Mirzoyan, A. Papoyan, and D. Sarkisyan. *High contrast D1 line electromagnetically induced transparency in nanometric-thin rubidium vapor cell*. preprint arXiv: 1102.3824 [atom-ph], 2007.

[Balabas10] M. Balabas, T. Karaulanov, M. Ledbetter, and D. Budker. *Polarized alkali-metal vapor with minute-long transverse spin-relaxation time*. Phys. Rev. Lett., 105: 070801, 2010.

[Gosh06] S. Ghosh, A. Bhagwat, C. Renshaw, S. Goh, and A. Gaeta. *Low-light-level optical interactions with rubidium vapor in a photonic band-gap fiber*. Phys. Rev. Lett., 97:2006, 2006.

The invention claimed is:

1. A device for imaging a microwave magnetic field polarization component ($B_-$, $B_\pi$, $B_+$) of a microwave relative to a static magnetic field ($B_0$), comprising:
a preparation means being designed to prepare an atomic vapor comprising a plurality of thermal atoms having a temperature between 10° C. and 300° C. in a first hyperfine state, particularly a dark state to applied laser light, which first hyperfine state is energetically split from other hyperfine states due to the zero-field hyperfine splitting and/or due to a static magnetic field ($B_0$) generated by said preparation means, such that said microwave whose magnetic field polarization component ($B_-$, $B_\pi$, $B_+$) is to be imaged is able to drive Rabi oscillations of said plurality of thermal atoms between said first hyperfine state and a second hyperfine state with a Rabi frequency ($\Omega_i(r)$) that is proportional to said magnetic field polarization component ($B_-$, $B_\pi$, $B_+$),
at least one cell enclosing said plurality of thermal atoms, and
an imaging means being designed to capture a state image in at least one of the hyperfine states of said plurality of atoms representing the spatial atomic density distribution ($N_e$) being a function of the Rabi frequency ($\Omega_i(r)$) of said Rabi oscillations.

2. The device according to claim 1, characterized in that the device further comprises a microwave generating device for generating said microwave comprising said magnetic field polarization component ($B_-$, $B_\pi$, $B_+$) to be imaged.

3. The device according to claim 2, characterized in that the microwave generating device is designed to be coupled to a microwave device or comprises a microwave device, so that said microwave device exhibits said microwave comprising said magnetic field polarization component ($B_-$, $B_\pi$, $B_+$) to be imaged when the microwave generating device is activated, wherein particularly the microwave device is designed to be interchangeable with another microwave device, and wherein particularly the microwave device is a coplanar wave guide.

4. The device according to claim 1, characterized in that the device comprises a controlling means being adapted to activate a microwave generating device for generating said microwave for a pre-defined duration ($dt_{mw}$) so that said microwave generated by the microwave generating device is a microwave pulse.

5. The device according to claim 4, characterized in that the controlling means is designed to switch on the laser for a first optical pumping period during which the microwave generating device is switched off or during which said microwave is not present, wherein particularly said first optical pumping period ($dt_{pump}$) has a duration in the range of 100 µs to 10 s, in particular 100 ms.

6. The device according to claim 1, characterized in that the plurality of thermal atoms is formed by alkali atoms, particularly $^{87}$Rb.

7. The device according to claim 1, characterized in that the preparation means comprises a laser being adapted to illuminate said plurality of thermal atoms so as to accumulate them in said first hyperfine state, wherein particularly in case said plurality of thermal atoms is formed by $^{87}$Rb atoms said laser is adapted to illuminate the $^{87}$Rb atoms with laser light (2) having a wavelength being resonant with the $D_2$ transition from $5^2S_{1/2}F=2$ to $5^2P_{3/2}F'=1$ or 2 of $^{87}$Rb such that the excited $^{87}$Rb atoms consequently decay into the first hyperfine state F=1.

8. The device according to claim 1, characterized in that the imaging means is designed to capture an absorption image or a fluorescence image as said state image, wherein the imaging means particularly comprises said laser being adapted to shine a laser pulse of a pre-defined duration ($dt_{img}$), particularly 10 µs, on the plurality of thermal atoms resonant with a transition from the second hyperfine state to an excited state, wherein particularly in case said plurality of thermal atoms is formed by $^{87}$Rb atoms said laser is adapted to shine a laser pulse of said pre-defined duration ($dt_{img}$) being resonant with the transition of $^{87}$Rb from $5^2S_{1/2}$ F=2 to $5^2P_{3/2}$ F'=3, wherein particularly the imaging means further comprises a camera for imaging the shadow cast by the resonant atoms excited by said laser pulse or the fluorescence of the resonant atoms excited by said laser pulse, and wherein particularly the controlling means is adapted to activate the laser for generating said laser pulse for said pre-defined duration ($dt_{img}$).

9. The device according to claim 1, characterized in that the device comprises a support for retaining the microwave generating device and/or for retaining a microwave device coupled to the microwave generating device or comprised by the microwave generating device, so that said microwave device exhibits said microwave comprising said magnetic field polarization component ($B_-$, $B_\pi$, $B_+$) to be imaged when the microwave generating device is activated, wherein particularly the microwave device is designed to be interchangeable with another microwave device, and wherein particularly the microwave device is a coplanar wave guide.

10. The device according to claim 9, characterized in that the support is designed to displace the microwave generating device and/or the microwave device normal to the extension plane (x-z) of the inner space of the at least one cell.

11. The device according to claim 9, characterized in that the support is designed to rotate the microwave generating device and/or the microwave device.

12. The device according to claim 1, characterized in that the at least one cell encloses a flat inner space for receiving the plurality of atoms, which inner space extends along an extension plane (x-z).

13. The device according to claim 1, characterized in that the preparation means comprises a static magnetic field generating means being adapted to generate said static magnetic field ($B_0$), particularly along any desired direction, wherein particularly said static magnetic field generating means comprises three pairs of Helmholtz coils.

14. The device according to claim 1, characterized in that the device comprises a heating means for heating said plurality of atoms residing in the at least one cell so as to adjust the pressure of the atomic vapor formed by the plurality of atoms, wherein the heating means is particularly designed to adjust the temperature of the cell in the range of 30° C. to 300° C., wherein particularly the heating means is formed as an oven enclosing the at least one cell.

15. The device according to claim 1, characterized in that the device comprises a vacuum pump connected to the at least one cell for evacuating the at least one cell.

16. The device according to claim 1, characterized in that the at least one cell is connected to an atomic reservoir containing atoms for forming said atomic vapor and/or in that atoms for forming said atomic vapor are deposited in the at least one cell, particularly in a first recess of the at least one cell.

17. The device according to claim 1, characterized in that the at least one cell is connected to a buffer gas reservoir containing buffer gas atoms for forming a buffer gas enclosed by the cell and/or in that atoms for forming a buffer gas are deposited in the at least one cell, particularly in a second recess of the at least one cell, wherein said atoms for forming a buffer gas are noble gas atoms, particularly Ne.

18. The device according to claim 1, characterized in that an inside of the at least one cell facing an inner space enclosed by the at least one cell comprises a coating, particularly an alkene coating, such that the probability that a hyperfine state of an atom of the atomic vapor survives upon a collision of the atom with the cell is increased compared to having no coating of said inside.

19. The device according to claim 1, characterized in that the device comprises a plurality of cells forming an array, particularly a micromachined array of cells, wherein the plurality of cells is particularly formed into a substrate, particularly a glass or a quartz substrate.

20. The device according to claim 19, characterized in that the cells are connected by conduits so as to allow for introducing atoms for forming the atomic vapor into the cells from a single atomic reservoir and/or so as to allow for introducing buffer gas atoms, particularly noble gas atoms, particularly Ne, into the cells from a single buffer gas reservoir.

21. The device according to claims 13 or 19, characterized in that the static magnetic generating means and the array of cells are integrated in a single device.

22. A method for sensing a microwave magnetic field polarization component ($B_-$, $B_\pi$, $B_+$) of a microwave relative to a static magnetic field $B_0$, comprising the steps of:
generating a static magnetic field $B_0$ having a predetermined direction and strength $B_0$,
preparing an atomic vapor comprising a plurality of thermal atoms having a temperature between 10° C. and 300° C. in a pre-defined first hyperfine state, particularly a dark state to applied laser light, in a static magnetic field such that the first hyperfine state is energetically split from at least one other hyperfine state,
generating a microwave comprising said magnetic field polarization component ($B_-$, $B_\pi$, $B_+$) to be sensed so that the microwave drives Rabi oscillations of said plurality of thermal atoms between said first hyperfine state and a second hyperfine state, which Rabi oscillations are proportional to said magnetic field polarization component ($B_-$, $B_\pi$, $B_+$), and
capturing a state image of said plurality of atoms representing the spatial atomic density distribution ($N_e$) being a function of the Rabi frequency ($\Omega_i(r)$) of said Rabi oscillations.

23. The method according to claim 22, characterized in that the plurality of thermal atoms are illuminated with laser light during a first optical pumping period ($dt_{pump}$), so as to accumulate them in said first hyperfine state, wherein particularly in case said plurality of thermal atoms is formed by $^{87}$Rb atoms said laser light has a wavelength being resonant with the $D_2$ transition from F=2 to F'=1 or 2 of $^{87}$Rb such that the excited $^{87}$Rb atoms consequently decay into the first hyperfine state F=1, wherein particularly said optical pumping period ($dt_{pump}$) has a length in the range from 100 μs to 10 s, in particular 100 ms.

24. The method according to claim 22, characterized in that said microwave is a microwave pulse having a pre-defined duration ($dt_{mw}$).

25. The method according to claim 22, characterized in that an absorption image or a fluorescence image is captured as said state image, wherein the state image is captured by shining a laser pulse of a pre-defined duration ($dt_{img}$), particularly 10 μs, on the plurality of thermal atoms resonant with a transition from the second hyperfine state to an excited state, wherein particularly in case said plurality of thermal atoms is formed by $^{87}$Rb atoms said laser pulse of said pre-defined duration ($dt_{img}$) is resonant with the transition of $^{87}$Rb from F=2 to F'=3, wherein the shadow cast by the resonant atoms excited by said laser pulse or the fluorescence of the resonant atoms excited by said laser pulse is imaged by a camera.

* * * * *